(12) United States Patent
Washida et al.

(10) Patent No.: US 6,239,981 B1
(45) Date of Patent: May 29, 2001

(54) PACKAGING SUBSTRATE

(75) Inventors: Tetsuro Washida; Masataka Wada, both of Tokyo (JP)

(73) Assignees: Mitsubishi Denki Kabushiki Kaisha; Mitsubishi Electric Engineering Co., Ltd., both of Tokyo (JP)

( * ) Notice: Subject to any disclaimer, the term of this patent is extended or adjusted under 35 U.S.C. 154(b) by 0 days.

(21) Appl. No.: 09/238,166

(22) Filed: Jan. 28, 1999

(30) Foreign Application Priority Data

Sep. 2, 1998 (JP) .................................................. 10-248184

(51) Int. Cl.⁷ ...................................................... H05K 1/18
(52) U.S. Cl. ........................ 361/760; 361/794; 361/715; 361/760; 257/697; 257/713
(58) Field of Search ..................................... 361/760, 761, 361/763, 791, 540, 777, 783, 782, 767, 772; 438/107, 125, 129; 257/723, 724, 693, 786

(56) References Cited

U.S. PATENT DOCUMENTS 4,780,795 * 10/1988 Meinel ................................. 361/402
5,689,600 * 11/1997 Griffin ..................................... 358/88
6,091,145 * 7/2000 Clayton ................................. 257/724

FOREIGN PATENT DOCUMENTS 2-68983    3/1990  (JP) .
5-218615   8/1993  (JP) .
7-169904   7/1995  (JP) .

* cited by examiner

*Primary Examiner*—Jeffrey Gaffin
*Assistant Examiner*—Thanh Y. Tran
(74) *Attorney, Agent, or Firm*—McDermott, Will & Emery

(57) ABSTRACT

A packaging substrate is provided such that an electronic components having a plurality of connecting terminals at their side edge portions and other kind of electronic component are mounted in high density on the substrate. More specifically, in a packaging substrate having IC packages (electronic components) surface mounted on the substrate, the package body of each IC package having a plurality of outwardly extending lead terminals at their side edge portions, the package body of the IC package includes at its side edge portion a specified length open region with no connecting terminal disposed therein. The IC packages are arranged in such a way that open regions of adjacent IC packages are positioned so as to confront each other and that front ends of individual leads are kept in closely spaced relation within a specified spacing range, a bypass capacitor (other kind of electronic component) being surface mounted between the open regions of the adjacent IC packages.

6 Claims, 4 Drawing Sheets

PACKAGING SUBSTRATE

BACKGROUND OF THE INVENTION

The present invention relates to a packaging substrate such that electronic components are surface-mounted on the substrate, each electronic component having at side edge portions thereof a plurality of outwardly extending connecting terminals.

When surface mounting electronic components (for example, IC packages with external lead terminals attached thereto), each having at side edge portions thereof a plurality of outwardly extending connecting terminals, on a substrate in adjacent relation to each other, it has hitherto been a typical practice to dispose a plurality of connecting terminals generally uniformly at given intervals at side edge portions of each electronic component, and to arrange them so that the connecting terminals of adjacent electronic components are positioned in opposed relation.

Various proposals intended for packaging density improvement in surface mount of such electronic components on a substrate have been made. In Japanese Patent Laid-Open Publication HEI 2-68983 (hereinafter, referred to as prior art 1), for example, there is disclosed an improvement in the layout of external lead terminals of electronic components.

In this prior art 1, as shown in FIG. 4, at side edge portions of the body 71 of each electronic component 70 (IC module), there are provided a pin arrangement portion 71A at which a plurality of lead terminals 72 are arranged in a side-by-side fashion and a no-pin portion 71B at which no pin is present. When mounting such electronic components 70 adjacent to each other on a printed board (not shown), the electronic components 70 are usually laid out in such a way that pin arrangement portions 71A and no-pin portions 71B, in combination, are so disposed as to define a diagonally crossing configuration so that each pin arrangement portion 71A of each electronic component 70 and the opposite side no-pin portion 71B are positioned in opposed relation.

By employing such arrangement, it is possible to reduce the length of the space required in the longitudinal direction of leads for mounting the electronic component 70 as compared with the prior art case in which adjacent electronic components are disposed so that plural leads substantially uniformly arranged at given intervals on side edge portions of the electronic components are positioned in opposed relation. That is, it is possible to increase the packaging density of the electronic components on the substrate.

In the case of a so-called memory IC, for example, one bypass capacitor is required for each IC package. Therefore, when mounting such an IC package on a substrate, it is necessary that a bypass capacitor to be annexed to the IC package is mounted adjacent thereto.

Hitherto, when mounting such an IC package and a bypass capacitor on a substrate, as FIG. 3 (hereinafter, referred to as prior art 2) illustrates by way of example, it has been a common practice to dispose a plurality of lead terminals 62 generally uniformly at given intervals on side edge portions of the body 61 of each IC package 60, and to lay out adjacent IC packages 60, with a bypass capacitor disposed therebetween, so that leads 62 of the adjacent IC packages 60 are positioned in opposed relation.

With such a layout, however, it is necessary to provide a length of the space extending in the longitudinal direction of leads 62 (lateral direction in FIG. 3) which corresponds to a cumulative total of the length Lp of IC package 60 including a component mounting land 63, the length Lc of a bypass capacitor 66 including a land 67, and a clearance Ls of such an order as not to allow any inter-component electrical short circuit.

Therefore, the longitudinal size of the space required for mounting components in place on substrate 51, as viewed in the longitudinal direction of leads, (that is, packaging density on the substrate), are determined according to the size of components (such as package length Lp and capacitor length Lc). Therefore, any further improvement in packaging density has not been possible. In the above mentioned case, spaces left open at opposite end sides of bypass capacitor 66 which extend along side edge portions of adjacent package bodies 61 (in a vertical direction as viewed in FIG. 3) are useless unoccupied spaces.

It is to be noted that, according to above mentioned prior art 1, the packaging density of electronic component 70 (IC module) only can be improved. However, other kind of electronic component (such as capacitor) cannot be disposed between adjacent electronic components 70. As such, when mounting an electronic component having a plurality of connecting terminals at side edge portions, and other kind of electronic component to be mounted in combination therewith, as in the case of IC package and a bypass capacitor therefor, the prior art 1 is not effectively applicable.

SUMMARY OF THE INVENTION

This invention has been developed in view of the above mentioned technical problems of the prior art. A primary object of the present invention is, therefore, to provide a packaging substrate such that electronic components having a plurality of connecting terminals at their side edge portions and other kind of electronic component can be mounted in high density on the substrate.

In order to achieve the above object, according to a first aspect of the present invention, there is provided a packaging substrate having electronic components surface mounted on the substrate, each electronic component having at side edge portions thereof a plurality of outwardly extending connecting terminals (hereinafter, referred to as first electronic component when appropriate), wherein the (first) electronic components, each including an open region of a specified length provided at its side edge portion, with no connecting terminal disposed therein, are arranged in such a way that open regions of adjacent electronic components are positioned to confront each other and that front ends of individual connecting terminals are kept in closely spaced relation within a specified spacing range, other kind of electronic component (hereinafter, referred to as second electronic component when appropriate) being surface mounted between the open regions of the adjacent (first) electronic components.

Also, according to a second aspect of the present invention, in a packaging substrate defined as the first aspect of the present invention, the (first) electronic component and other kind of electronic component (second electronic component) are respectively packaged in plurality so that the plurality of the (first) electronic components are arranged in substantially parallel relation along a straight line extending longitudinally of connecting terminals thereof and so that the plurality of other kind of electronic component (second electronic component) are arranged in substantially parallel relation along the longitudinally extending straight line.

Further, according to a third aspect of the present invention, in a packaging substrate defined as the first or second aspect of the present invention, the open region includes a central portion of side edge portion of each (first) electronic component.

Furthermore, according to a fourth aspect of the present invention, in a packaging substrate embodying one of the first to third aspects of the present invention, each of the (first) electronic components is an IC package, the other kind of electronic component (second electronic component) being a capacitor annexed to each IC package.

In the first aspect of the present invention, electronic components (first electronic components) to be mounted on the packaging substrate of the present invention, each having a plurality of connecting terminals on its side edge portions, are provided with at their side edge portions open regions of a given length in which no connecting terminal is mounted. Adjacent first electronic components are arranged in such a way that their respective open regions are positioned in opposed relation and that the front ends of mutually confronted connecting terminals are positioned as close as possible to each other within a distance range in which the clearance between front ends of the connecting terminals is maintained at a given distance value. Other kind of electronic component (second electronic component) is surface mounted between open regions of the first electronic components.

Since the second electronic component is mounted between adjacent first electronic components by utilizing the open region in which no connecting terminal is disposed, the adjacent first electronic components can be positioned as close as possible to each other within a distance range in which the clearance between front ends of the connecting terminals can be maintained at a given value (e.g., a minimal distance which will not cause any trouble such as electric short circuit between connecting terminals.

Thus, the required length of the space in the longitudinal direction of the connecting terminals can be considerably reduced as compared with conventional practice (prior art 2; see FIG. 3) in which adjacent first electronic components, each having a plurality of connecting terminals disposed generally uniformly at given intervals on their side edge portions, are laid out in such a way that the connecting terminals are positioned in opposed relation with other kind of electronic component (second electronic component) disposed between them. Therefore, when mounting (first) electronic components having a plurality of connecting terminals at their side edge portions and other kind of electronic component (second electronic component) on the substrate, it is possible to achieve packaging with much higher density as compared with the prior art.

Also, in the second aspect of the present invention, the packaging substrate provides the same effect as that obtainable according to the first aspect of the invention. In particular, since the first electronic component and other kind of electronic component (second electronic component) can be respectively packaged in plurality so that the plurality of the first electronic components are arranged in substantially parallel relation along a straight line extending longitudinally of the connecting terminals thereof and so that the plurality of second electronic component are arranged in substantially parallel relation along the straight line extending along the same line, it is possible to simplify the board wiring. Further, since the board wiring between the first and second electronic components can be reduced in length, it is possible to obtain improvement in electric characteristics such as noise reduction.

Furthermore, in the third aspect of the invention, the packaging substrate provides the same effect as that obtainable according to the first or the second aspect of the present invention. In particular, since the open region includes a central portion of side edge portion of first electronic component, it is possible to dispose the second electronic component in the open space including the central portion of side edge portions between adjacent first electronic components, it. being thus possible to obtain greater convenience in electrically connecting the first and second electronic components.

Furthermore, in the fourth aspect of the present invention, the packaging substrate provides the same effect as that obtainable according to one of the first to third aspects of the present invention in mounting IC packages, as first electronic component, and a capacitor annexed to each IC package, as other kind of electronic component, on the substrate.

DETAILED DESCRIPTION OF THE PREFERRED EMBODIMENTS

Preferred embodiments of the invention will now be described in detail with reference to the accompanying drawings.

Embodiment 1

Figure 1:
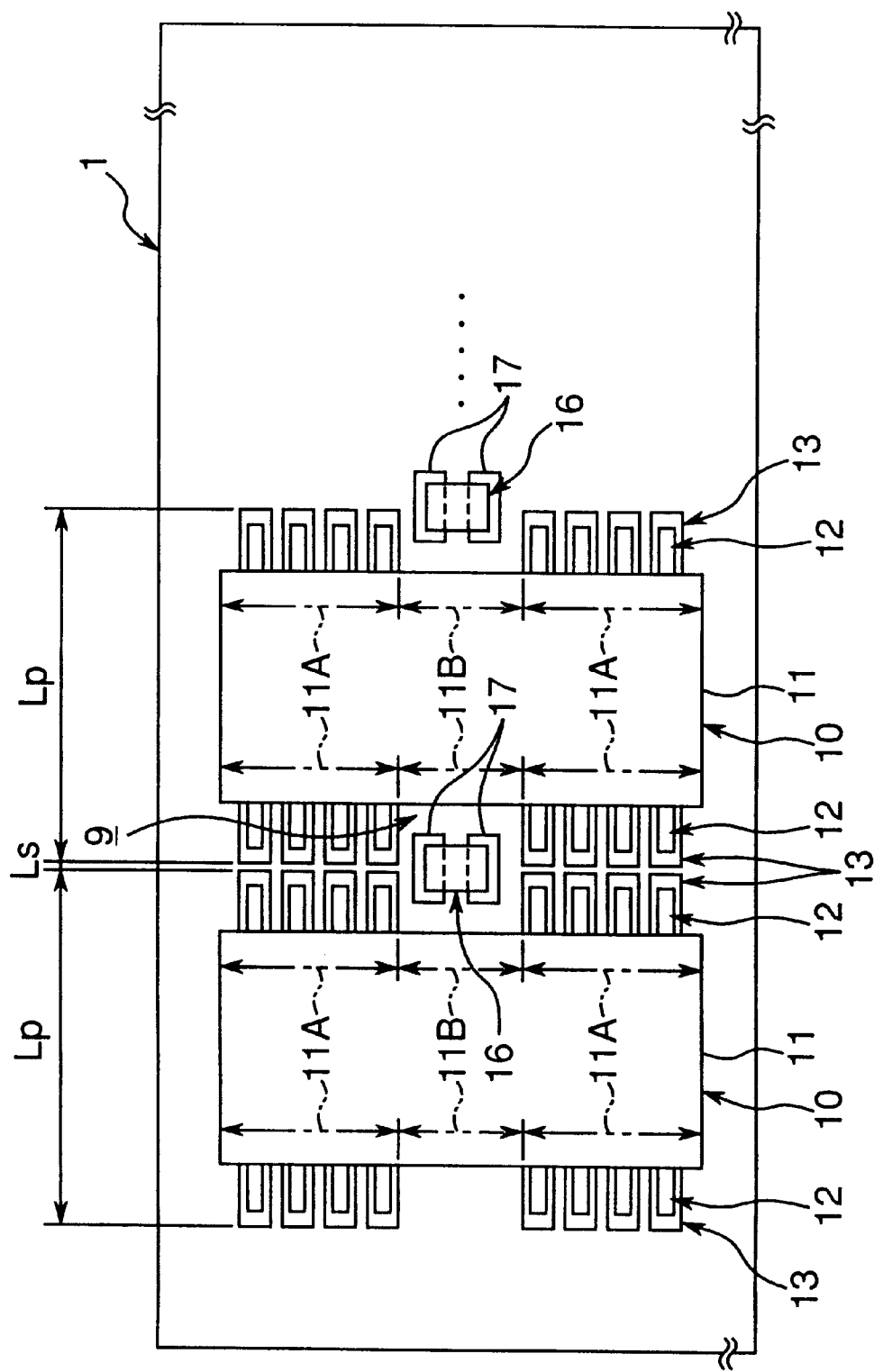
FIG. 1 is an explanatory plan view illustrating a packaging substrate according to a first embodiment of the present invention.

FIG. 1 is an explanatory plan view illustrating a packaging substrate 1 of a first embodiment of the present invention. As shown in this figure, on the surface of the packaging substrate 1, there are surface mounted IC packages 10 as electronic components (first electronic components), each having a plurality of outwardly extending lead terminals at side edge portions of the body thereof, and bypass capacitors 16 as other kind of electronic components (second electronic components) to be disposed in combination therewith.

Preferably, IC package 10 incorporates a so-called memory IC (not shown) which is writable/recordable/readable. The memory IC is usually employed with a bypass capacitor 16 attached thereto. body 11, there are provided lead mount regions 11A in each of which lead terminals 12 are concentratedly arranged (in the present embodiment, four leads 12 are arranged side by side at a narrow pitch), and an open region 11B of a given length having no lead 12 disposed therein. As above mentioned, the open region 11B preferably includes a central portion of the side edge portion of the package body 11.

When surface mounting adjacent IC packages 10 and a bypass capacitor 16 to be annexed to each IC package 10 on the substrate 1, the IC packages 10 are arranged in such a way that their respective open regions 11B are positioned in opposed relation and that the front ends of mutually confronted lead terminals 12 (more specifically, front ends of lands 13 for leads to which leads 12 are securely fixed) are positioned as close as possible so that the distance Ls between the front ends of mutually confronted leads 12 is maintained within a given value range.

For the distance Ls between front ends of lands 13 for leads, it is necessary to keep a clearance of such order as required to prevent electrical short circuit between individual lead terminals 12. In the present embodiment, the clearance Ls is set to not less than 0.5 mm.

By arranging adjacent IC packages 10 as above mentioned, there is formed an unoccupied space 9 in which The term "IC package" used herein basically means "lone electronic component formed by resin sealing and packaging at least one IC chip including at least an IC circuitry, and electrodes and the like electrically wired on the chip".

The plurality of lead terminals 12 (for example, 8 leads at one side of the package body 11) are arranged in such a way that they extend outwardly of side edge portions of the package body 11 of each IC package 10. The front end portions of the leads 12 being securely fixed to the. surface of the package body 11 through lands 13 for the leads.

Whilst, above mentioned bypass capacitor 16 is of a chip type, for example, and opposite ends of the chip as viewed in the longitudinal direction thereof (vertical direction in FIG. 1) are securely fixed to the surface of the package body 11 through lands 17 for the capacitor.

In the present embodiment, the plurality of leads 12 are concentratedly disposed, except for a region of a given length including a central portion of the side edge portion , in only regions extending along side edge portion of the package body 11 which are situated on both sides of the region of a given length including the above mentioned central portion.

That is, on the side edge portions of the package no lead 12 is disposed. A bypass capacitor 16 to be combined with one of the IC packages is disposed in the unoccupied space 9.

In this case, therefore, the required length of the space in the longitudinal direction of the lead terminals 12 (lateral direction in FIG. 1) may be a mere cumulative total of the length Lp of IC package 10 including a lead mounting land 13, and a clearance Ls of such an order as not to allow any electrical short circuit between lead terminals 12.

Figure 3:
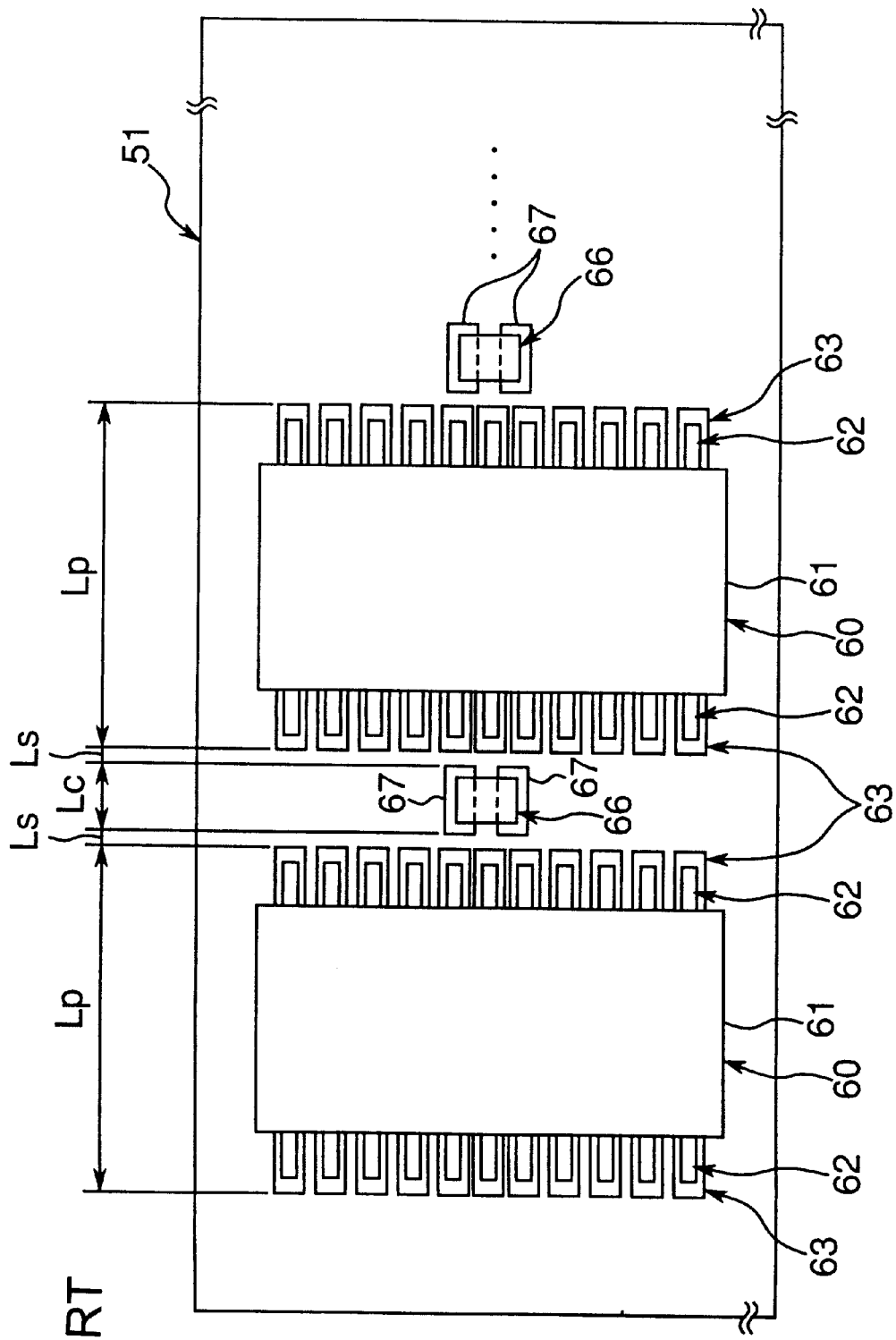
FIG. 3 is an explanatory plan view illustrating a packaging substrate according to prior art 2.
Figure 4:
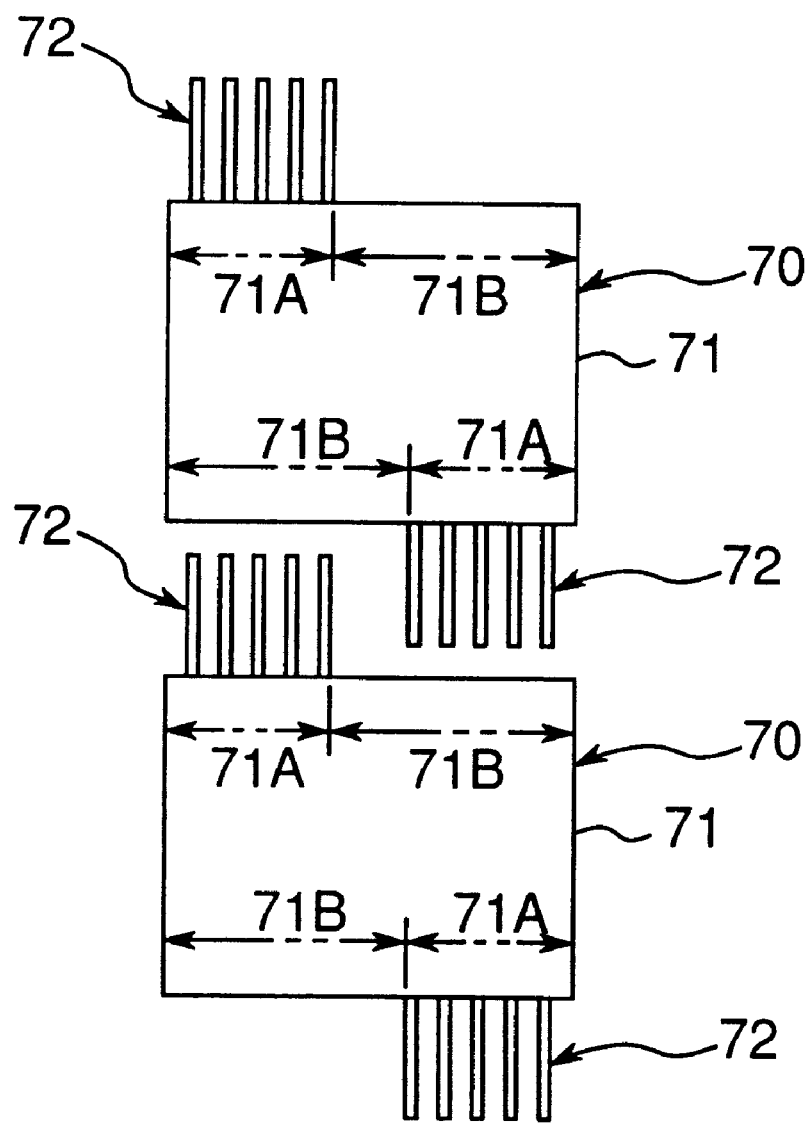
FIG. 4 is an explanatory plan view illustrating electronic components and arrangement thereof according to prior art 1.

Therefore, when mounting IC packages 10 and a bypass capacitor 16 therefor on substrate 1, it is possible to substantially reduce the required length of the space in the longitudinal direction of lead terminals 12 as compared with the prior art 2 (see FIG. 3), if respective components are of same size. Thus, packaging density can be increased so much.

In the present embodiment, by way of example, the length Lp of IC package 10 including land 13 for leads is set to 15.1 mm, the length of lead terminal 12 from side edge portion of the package body 11 to front end of the lead 12 is set to 0.8 mm, and the length of land 13 for lands from side edge portion of the package body 11 to front end of the land 13 for leads is set to 1.2 mm. Therefore, the distance between package bodies 11 of adjacent IC packages 10 is not less than 2.9 mm. Whilst, the width of bypass capacitor 16 including land 17 for capacitors is set to about 1.7 mm.

As above described, according to the present embodiment, the bypass capacitor 16 as the second electronic component is mounted in the unoccupied space 9 between adjacent IC packages 10 (first electronic component) by utilizing the open regions 11B in which no lead terminal is disposed. Therefore, the adjacent IC packages 10 can be disposed as close to each other as possible within a distance range in which the clearance between front ends of mutually confronted lead terminals 12 of respective IC packages can be maintained at a given value (e.g., a minimal distance which will not cause any trouble such as electric short circuit between lead terminals 12).

Thus, the required length of the space in the longitudinal direction of the lead terminals 12 can be considerably reduced as compared with conventional practice (prior art 2; see FIG. 3) wherein adjacent IC packages 60, with a bypass capacitor 66 disposed between them, are laid out in such a way that a plurality of lead terminals 62 are arranged generally uniformly at given intervals in side edge portion of package body 61 of IC package 60, so that lead terminals 62 are positioned in opposed relation.

Therefore, when mounting IC package 10 and a bypass capacitor 16 therefor on a substrate 1, it is possible to achieve packaging with much higher density as compared with the prior art.

Further, since the open region 11B of each package body 11 includes a central portion of side edge portion of the package body 11, a bypass capacitor 16 can be disposed in an unoccupied space 9 including a central portion of side edge portion of each of adjacent IC packages. This will contribute to enhancing the convenience in electrically connecting a portion of the bypass capacitor 16 and a portion of IC package 10.

Embodiment 2

Next, a second embodiment of the invention will be described. In the following description, constituent elements of which the construction and the function are similar to those in the first embodiment are designated by the same reference numerals as in the case of the first embodiment, and any further description is omitted.

Figure 2:
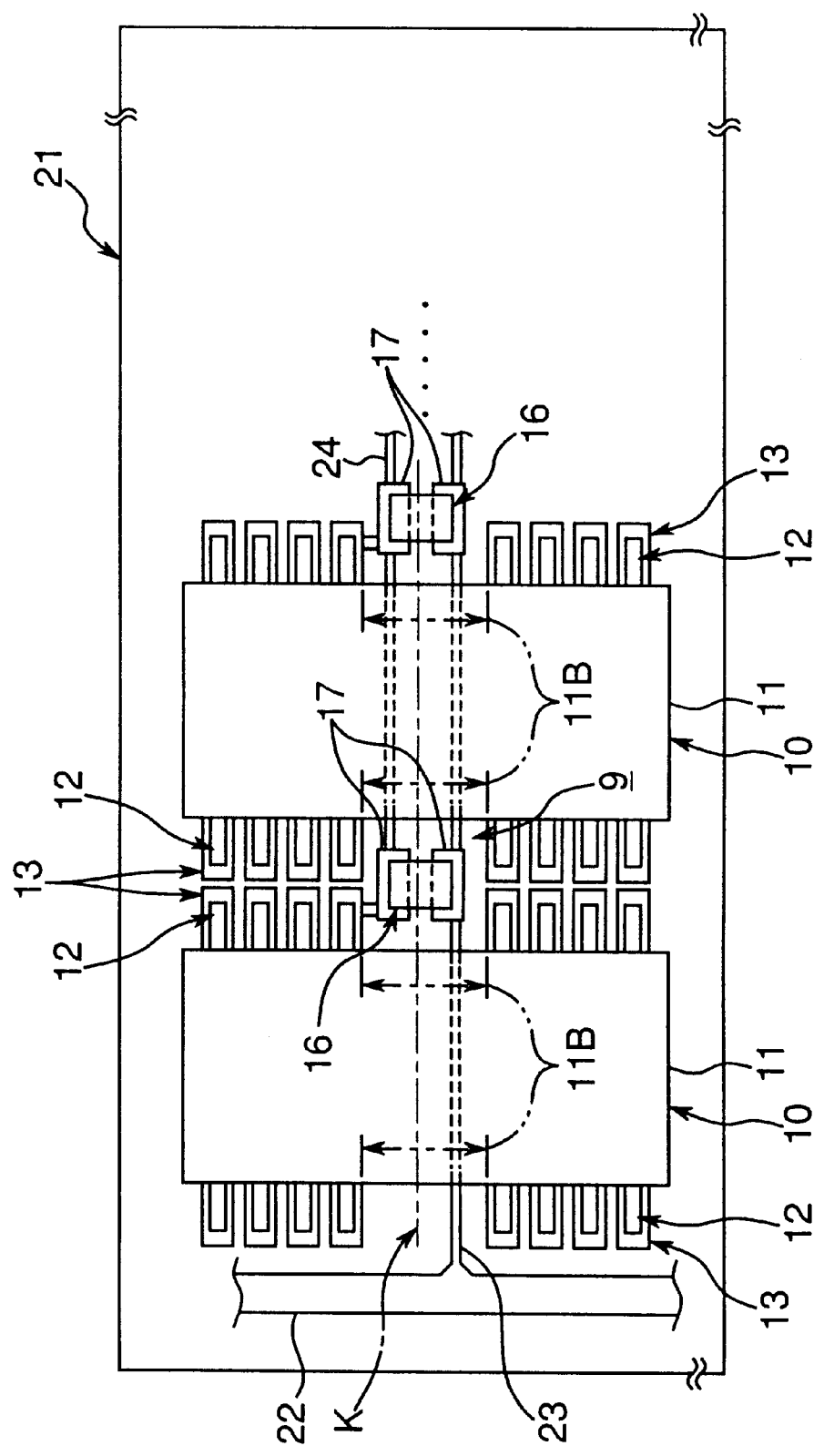
FIG. 2 is an explanatory plan view illustrating a packaging substrate according to a second embodiment of the invention.

FIG. 2 is an explanatory plan view of a packaging substrate 21 of the second embodiment of the invention. In the second embodiment, as shown in this figure, a plurality of IC packages 10 are arranged generally in alignment along a straight line extending in longitudinal direction of lead terminals 12, and more specifically in such a way that the center line of each package body 11 which extends in the longitudinal direction of lead terminals coincides with one straight line (center line K) into alignment thereon.

Therefore, open regions 11B provided in the package bodies 11 come into alignment along the center line K, and unoccupied spaces 9 which are formed by open regions 11B of adjacent IC packages 10 being positioned in opposed relation are also aligned along the center line K. Accordingly, bypass capacitors 16 are also to be aligned along the center line K.

At one end portion of the packaging substrate 21 (leftward end portion in FIG. 2), there is provided a main ground layer 22, as board wiring, which extends in parallel or generally in parallel to left side edge of the package body 11. Branched from a mid portion of the main ground layer 22, there is provided a linear branch ground layer 23 extending along the center line K. Further, a linear power supply layer 24 is provided which extends in parallel along the branch ground layer 23 (that is, in parallel with the center line K).

According to above described second embodiment, it is possible to obtain same effect as in the case of the first embodiment. In particular, when mounting IC packages 10, as first electronic component, and bypass capacitors 16, as other kind of electronic component (second electronic component), both in plurality, these IC packages 10 and bypass capacitors 16 are arranged generally in parallel along a straight line (center line K) extending in the longitudinal direction of lead terminals 12. Therefore, the board wiring to be connected to those IC packages 10 and bypass capacitors 16 (branch ground layer 23 and power supply layer 24) can be arranged in linear form. Accordingly, it is possible to simplify the board wiring of the packaging substrate 21.

Furthermore, since board wiring between each IC package 10 and bypass capacitor 16 can be made shorter than that in the prior art, it is possible to achieve improvement in electrical characteristics, such as decrease in noise occurrence, of finished products with the packaging substrates 21 incorporated therein.

In the foregoing embodiments, by way of example, IC packages 10 with memory IC mounted therein, and a bypass capacitor 16 annexed to each IC package 10 are mounted on substrate 1; 21. It is understood, however, that the present invention is not limited to the embodiments, and that the invention is effectively applicable to various other cases where electronic components having a plurality of connecting terminals at its side edge portion and other kinds of electronic components are mounted on a substrate.

In the above described embodiments, open regions having no connecting terminals are provided in side edge portion of IC package 10 (first electronic component) including a central portion of a side edge portion of the first electronic component. However, such open regions need not necessarily include aforesaid central portion.

In this way, the present invention is not limited to the foregoing embodiments which must be taken merely as exemplary, and various changes, modifications, and design improvement may be made without departing from the spirit and scope of the invention.

What is claimed is:

1. A packaging substrate comprising:
   a pair of identical first type electronic components surface mounted on the substrate, each first type electronic component having at side edge portions thereof a plurality of outwardly extending connecting terminals,
   an open region of a specified length provided at the side edge portions of each said 1st type electronic components, said open region containing no connecting terminal disposed therein,
   said pair of first type electronic components being positioned such that open regions of adjacent first type electronic components are positioned to confront each other and that front ends of individual connecting terminals are kept in closely spaced relation within a specified spacing range, and
   a second type of electronic component surface mounted between the open regions of the adjacent electronic components.

2. A packaging substrate as set forth in claim 1, wherein the open region includes a central portion of side edge portion of each first type electronic component.

3. A packaging substrate as set forth in claim 1, wherein each of the first type electronic components is an IC package, the second type electronic component being a capacitor surface mounted adjacent to each IC package on the substrate for use in combination with said IC package.

4. A packaging substrate as set forth in claim 1, wherein each of the first type electronic components and second type electronic component are respectively packaged in plurality so that a plurality of first type electronic components are arranged in substantially parallel relation along a straight line extending longitudinally of the connecting terminals thereof and so that the plurality of second type electronic components are arranged in substantially parallel relation along the longitudinally extending straight line.

5. A packaging substrate as set forth in claim 4, wherein the open region includes a central portion of side edge portion of each first type electronic component.

6. A packaging substrate as set forth in claim 4, wherein each of the first type electronic components is an IC package, the second type electronic component being a capacitor surface mounted adjacent to each IC package of the substrate for use in with said IC package.

* * * * *